US009496338B2

(12) United States Patent
Chang et al.

(10) Patent No.: US 9,496,338 B2
(45) Date of Patent: Nov. 15, 2016

(54) WIRE-LAST GATE-ALL-AROUND NANOWIRE FET

(71) Applicant: International Business Machines Corporation, Armonk, NY (US)

(72) Inventors: Josephine B. Chang, Bedford Hills, NY (US); Michael A. Guillorn, Cold Spring, NY (US); Isaac Lauer, Yorktown Heights, NY (US); Jeffrey W. Sleight, Ridgefield, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/659,796

(22) Filed: Mar. 17, 2015

(65) Prior Publication Data

US 2016/0276432 A1 Sep. 22, 2016

(51) Int. Cl.
| | | |
|---|---|---|
| H01L 21/324 | (2006.01) | |
| H01L 29/06 | (2006.01) | |
| H01L 29/66 | (2006.01) | |
| H01L 21/306 | (2006.01) | |
| H01L 21/02 | (2006.01) | |
| H01L 21/8234 | (2006.01) | |
| H01L 27/088 | (2006.01) | |

(52) U.S. Cl.
CPC ....... *H01L 29/0673* (2013.01); *H01L 21/0217* (2013.01); *H01L 21/02381* (2013.01); *H01L 21/02532* (2013.01); *H01L 21/30604* (2013.01); *H01L 21/324* (2013.01); *H01L 21/823431* (2013.01); *H01L 27/0886* (2013.01); *H01L 29/0649* (2013.01); *H01L 29/66545* (2013.01); *H01L 29/66553* (2013.01)

(58) Field of Classification Search
CPC . H01L 21/20; H01L 21/30; H01L 21/30604; H01L 21/324
See application file for complete search history.

(56) References Cited

U.S. PATENT DOCUMENTS

| | | | |
|---|---|---|---|
| 7,820,513 B2 | 10/2010 | Hareland et al. | |
| 7,915,167 B2 | 3/2011 | Radosavljevic et al. | |
| 7,923,337 B2 | 4/2011 | Chang et al. | |
| 8,541,274 B1 | 9/2013 | Xie et al. | |
| 8,592,280 B2 | 11/2013 | Chang et al. | |
| 8,637,359 B2 | 1/2014 | Chang et al. | |
| 8,697,501 B1 | 4/2014 | Choi et al. | |
| 8,735,232 B2 | 5/2014 | Baars et al. | |

(Continued)

OTHER PUBLICATIONS

Bangsaruntip et al., "Density scaling with gate-all-around silicon nanowire MOSFETs for the 10 nm node and beyond," IEEE International Electron Devices Meeting (IEDM), 2013, pp. 20.2.1-20.2.4.

*Primary Examiner* — Thanh V Pham
(74) *Attorney, Agent, or Firm* — Cantor Colburn LLP; Vazken Alexanian

(57) ABSTRACT

A nanowire field effect transistor (FET) device includes a first source/drain region and a second source/drain region. Each of the first and second source/drain regions are formed on an upper surface of a bulk semiconductor substrate. A gate region is interposed between the first and second source/drain regions, and directly on the upper surface of the bulk semiconductor substrate. A plurality of nanowires are formed only in the gate region. The nanowires are suspended above the semiconductor substrate and define gate channels of the nanowire FET device. A gate structure includes a gate electrode formed in the gate region such that the gate electrode contacts an entire surface of each nanowire.

15 Claims, 23 Drawing Sheets

CROSS-SECTIONAL VIEW ALONG LINE A-A'

CROSS-SECTIONAL VIEW ALONG LINE A-A'

(56) References Cited

U.S. PATENT DOCUMENTS

| | | | |
|---|---|---|---|
| 2010/0232200 A1* | 9/2010 | Shepard | G11C 13/0004 365/51 |
| 2012/0007051 A1 | 1/2012 | Bangsaruntip et al. | |
| 2012/0313170 A1 | 12/2012 | Chang et al. | |
| 2013/0092992 A1 | 4/2013 | Chang et al. | |
| 2014/0151705 A1* | 6/2014 | Xiao | B82Y 10/00 257/64 |
| 2014/0203334 A1 | 7/2014 | Colinge et al. | |
| 2014/0217364 A1 | 8/2014 | Chang et al. | |
| 2015/0228782 A1* | 8/2015 | Lin | H01L 29/785 257/24 |
| 2016/0020209 A1* | 1/2016 | Anderson | H01L 21/845 257/383 |
| 2016/0071931 A1* | 3/2016 | Cheng | H01L 21/0245 257/329 |
| 2016/0071945 A1* | 3/2016 | Wang | H01L 29/42392 257/347 |
| 2016/0093740 A1* | 3/2016 | Harley | H01L 29/7851 257/347 |

* cited by examiner

CROSS-SECTIONAL VIEW ALONG LINE A-A'

CROSS-SECTIONAL VIEW ALONG LINE A-A'

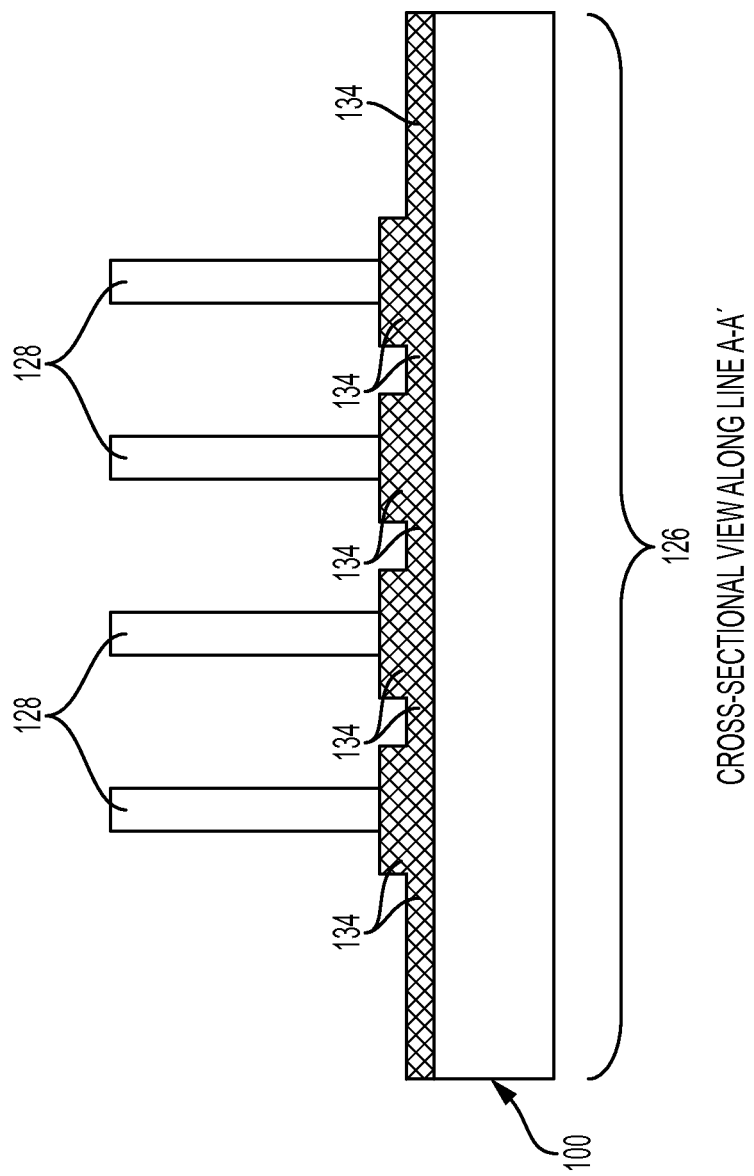

WIRE-LAST GATE-ALL-AROUND NANOWIRE FET

BACKGROUND

The present disclosure generally relates to a semiconductor device, and more particularly, to nanowire field effect transistor (FET) devices.

The use of non-planar semiconductor devices such as, for example, Fin FET devices (i.e., FinFETs) is desirable due the ability to reduce the overall size of the semiconductor device. The fabrication of non-planar semiconductor devices such as, for example, wire-last gate-all-around FinFET devices, typically utilizes a semiconductor-on-insulator (SOI) substrate to reduce parasitic device capacitance. SOI substrates typically include a bulk substrate, a buried insulator layer located atop the bulk substrate, and a semiconductor-on-insulator (SOI) layer located atop the buried insulator layer. However, the cost associated with SOI substrates and the minimum thickness requirements due to the buried insulator layer has motivated efforts to reconsider forming non-planar semiconductor devices on a bulk semiconductor substrate.

SUMMARY

According to at least one embodiment, a method of fabricating a nanowire field effect transistor (FET) device comprises forming a plurality of fins on a bulk substrate of a first type semiconductor material and forming epitaxial semiconductor regions of a second semiconductor type material adjacent bottom portions of the plurality of fins. The second semiconductor type material is different from the first semiconductor type material. The method further includes performing an anneal process that condenses the second type semiconductor material directly beneath the plurality of fins. The method further includes selectively removing the second type semiconductor material with respect to the first type semiconductor material to form a plurality of nanowires from the plurality of fins such that the nanowires are suspended over the bulk substrate.

According to another embodiment, a nanowire field effect transistor (FET) device comprises a first source/drain region and a second source/drain region. Each of the first and second source/drain regions are on an upper surface of a bulk semiconductor substrate. A gate region is interposed between the first and second source/drain regions, and directly on the upper surface of the bulk semiconductor substrate. A plurality of nanowires are formed only in the gate region. The nanowires are suspended above the semiconductor substrate and define gate channels of the nanowire FET device. A gate structure includes a gate electrode in the gate region, where the gate electrode contacts an entire surface of each nanowire.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings.

FIGS. 1-18 are a series of views illustrating a method of forming a wire-last gate-all-around nanowire FET according to exemplary embodiments of the present teachings, in which:

FIG. 1 is a cross sectional view of an initial bulk semiconductor substrate;

FIG. 2 illustrates the bulk semiconductor substrate of FIG. 1 following a shallow trench isolation (STI) technique oxide fill process to form insulator liners at opposite edges of the bulk semiconductor substrate;

FIG. 3 illustrates the bulk semiconductor substrate of FIG. 2 following deposition of an insulator layer on an upper surface of the bulk semiconductor substrate and on the upper surface of the shallow insulator liners;

FIG. 4 illustrates the bulk semiconductor substrate of FIG. 3 following deposition of a hard mask layer and patterning of a plurality of resist elements on an upper surface of the hard mask layer;

FIG. 5 illustrates the bulk semiconductor substrate of FIG. 4 after patterning the hard mask layer and removing the resist elements such that a plurality of hard mask elements are formed on an upper surface of the insulator layer;

FIG. 6 illustrates the bulk semiconductor substrate of FIG. 5 following formation of a dummy gate stack on the upper surface of the bulk semiconductor substrate to cover the hard mask elements;

FIG. 7 illustrates the bulk semiconductor substrate of FIG. 6 following a gap fill process that fills regions adjacent to the side walls of the dummy gate stack with an insulator material following an etching process that exposes the upper surface of the dummy gate;

FIG. 8 illustrates the bulk semiconductor substrate of FIG. 7 following a chemical mechanical planarization (CMP) process that stops on the dummy gate;

FIG. 9 illustrates the bulk semiconductor substrate of FIG. 8 following removal of the dummy gate to form a gate trench that exposes the plurality of hard mask elements interposed between side walls of the gate structure;

FIG. 10 illustrates the bulk semiconductor substrate of FIG. 9 following an etching process that forms a plurality of semiconductor fins between side walls of the gate stack;

FIG. 13 illustrates the bulk semiconductor substrate of FIGS. 12A and 12B while undergoing an annealing process to condense the silicon germanium;

FIG. 14 illustrates the bulk semiconductor substrate of FIG. 13 after condensing the silicon germanium into a portion of the fins located beneath the hard mask elements;

FIG. 15B illustrates the bulk semiconductor substrate of FIG. 15A taken along line A-A';

FIG. 18 illustrates a completed nanowire FET formed on a bulk semiconductor substrate after removing the filler layer and revealing the source/drain regions.

DETAILED DESCRIPTION

Various non-limiting embodiments of the invention provide a nanowire FET formed on a bulk semiconductor substrate. The nanowires are suspended above the bulk semiconductor substrate by sidewalls of a gate structure. A gate electrode is formed in the structure, which contacts the entire surface of each nanowire. According to another embodiment, a wire-last gate-all-around fabrication process forms a nanowire FET formed on a bulk semiconductor substrate. The nanowire FET includes a plurality of semiconductor nanowires suspended above a portion of the bulk semiconductor substrate, and a gate electrode contacts the entire surface (i.e., all sides) of each nanowire in the gate region. Accordingly, a gate-all-around nanowire FET may be fabricated on a bulk semiconductor device, while reducing thickness and costs associated with conventional silicon-on-substrate FET devices.

Figure 1:
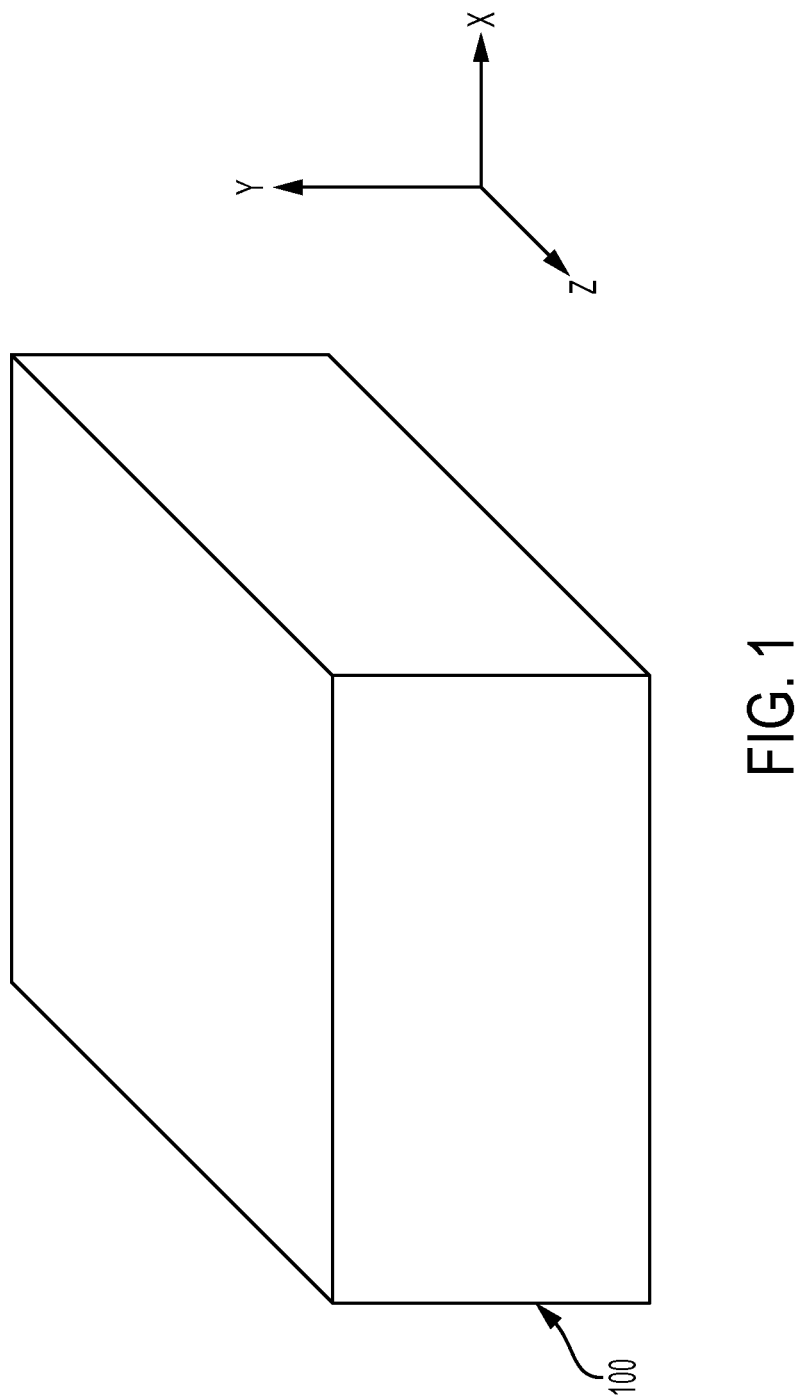

With reference now to FIG. 1, a bulk semiconductor substrate 100 is illustrated according to a non-limiting embodiment of the invention. The semiconductor substrate 100 extends along a first axis (e.g., an X-axis) to define a length, a second axis (e.g., a Y-axis) to define a width, and a third axis (e.g., a Z-axis) to define a height, i.e., thickness. The semiconductor substrate 100 comprises various materials including, but not limited to, silicon (Si). The semiconductor substrate 100 may also have a thickness ranging from about 30 nanometers (nm) to about 40 nm.

Figure 2:
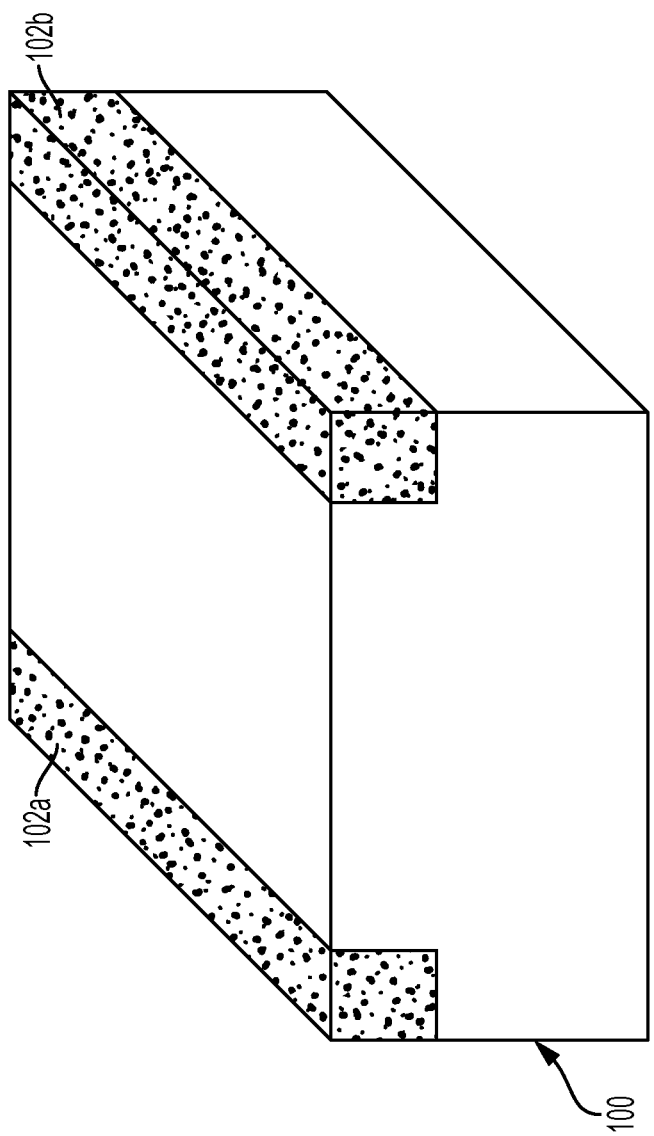

Referring to FIG. 2, a shallow trench isolation (STI) process is performed on applied to the semiconductor substrate 100. The STI process forms a first insulator liner 102a at a first edge region of the semiconductor substrate 100 and a second insulator liner 102b at an opposite edge region of the semiconductor substrate 100. The STI process includes etching the first and second edge regions of the semiconductor substrate 100 and refilling the etched portions with an insulator dielectric material including, but not limited to, silicon dioxide ($SiO_2$) as understood by one of ordinary skill in the art. Each insulator liner 102a-102b may have a length ranging from approximately 10 nm nanometers to approximately 30 nm, a height ranging from approximately 15 nm to approximately 25 nm, and may extend along the full width of the semiconductor substrate 100.

Figure 3:
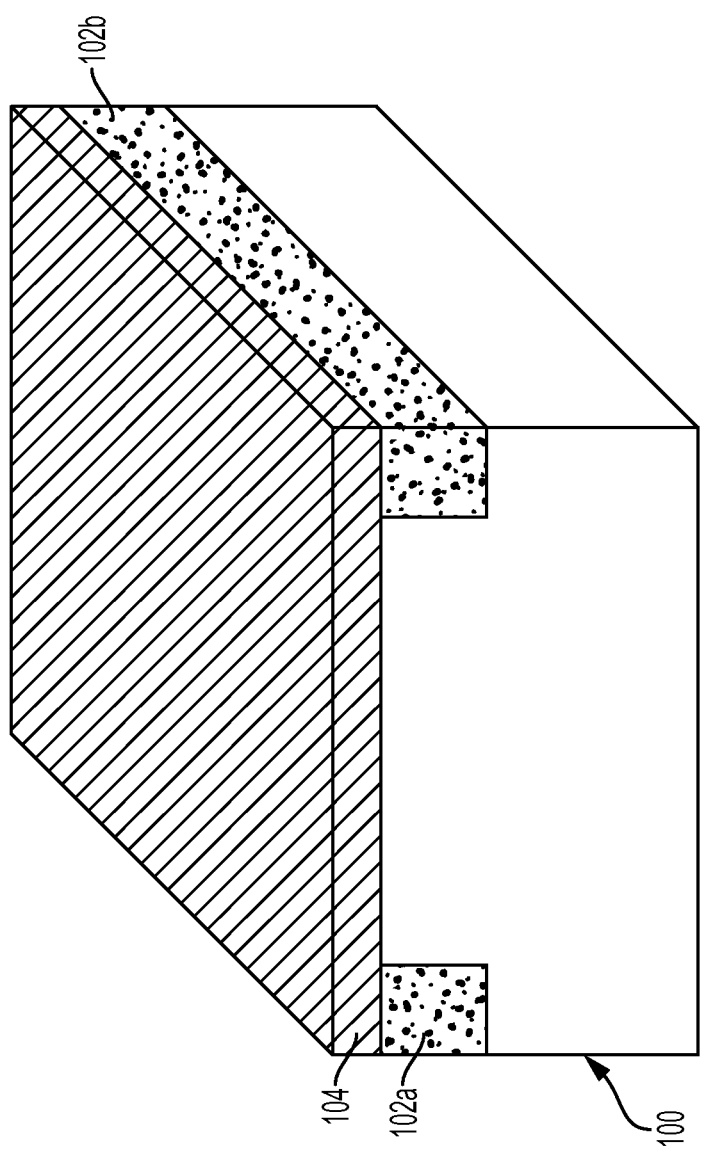

Referring to FIG. 3, an insulator layer 104 is formed on an upper surface of the semiconductor substrate 100 and may also be formed on an upper surface of each insulator liner 102a-102b. The insulator layer 104 may be formed from various dielectric materials including, but not limited to, $SiO_2$ and may have a thickness ranging from about 5 nm to about 10 nm. Various deposition processes may be used to deposit the insulator layer 104 including, but not limited to, chemical vapor deposition (CVD).

Figure 4:
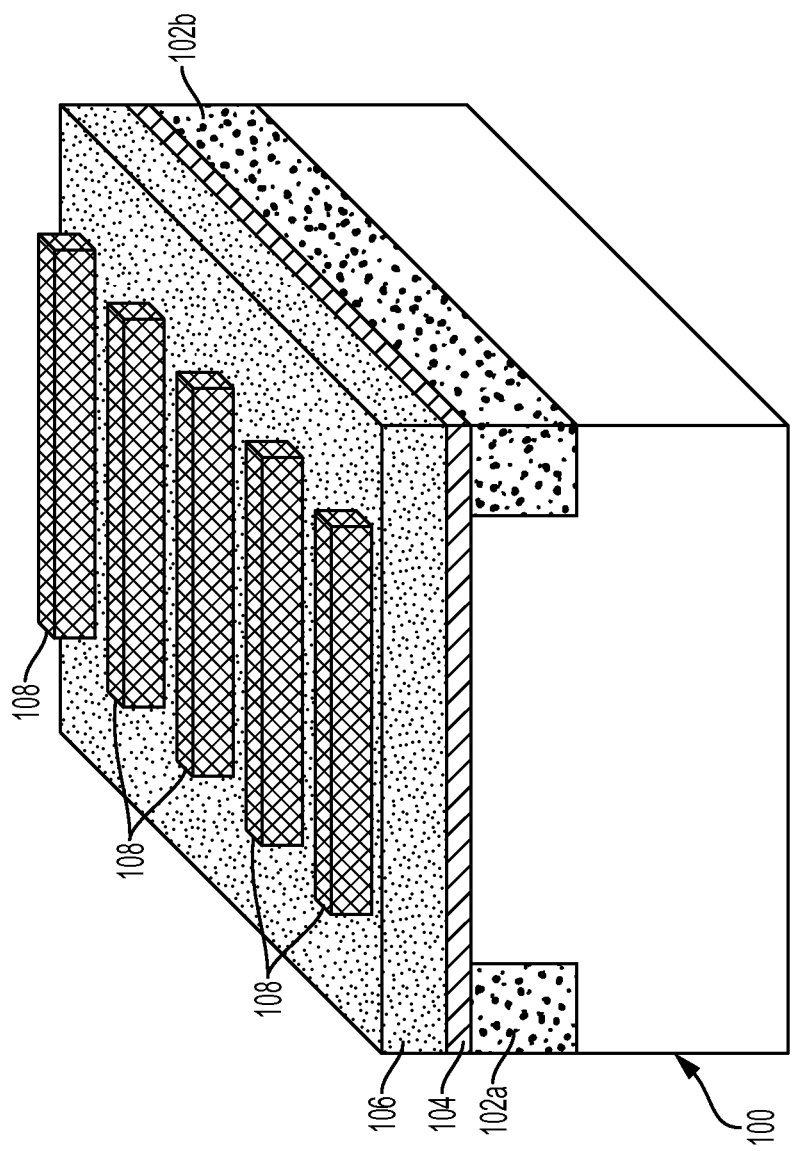

Turning to FIG. 4, a masking layer 106 is formed on an upper surface of the insulator layer 104. The masking layer 106 includes a plurality of fin patterned elements 108 formed on an upper surface thereof. The plurality of fin patterned elements 108 ultimately define a pattern of a fin hardmasks, which are described in greater detail below. It will be appreciated that the fin patterned elements 108 may be formed in any suitable matter known in the art, such as by lithographic patterning of a photoresist material. Alternatively, the fin patterned elements 108 may be formed by a sidewall image transfer (SIT) process. The masking layer 106 may comprise a nitride material such as, for example, silicon nitride (SiN). The fin patterned elements 108 may, in the case of SIT, comprise a high dielectric constant (i.e., a high-k dielectric) material such as, for example, hafnium silicate ($HfSiO_4$), hafnium dioxide ($HfO_2$), and zirconium dioxide ($ZrO_2$). Each fin patterned element 108 may have a length that extends between the insulator liners 102a-102b. According to another embodiment, however, the fin patterned elements 108 may have ends that extend beyond the insulator liners 102a-102b.

Figure 5:
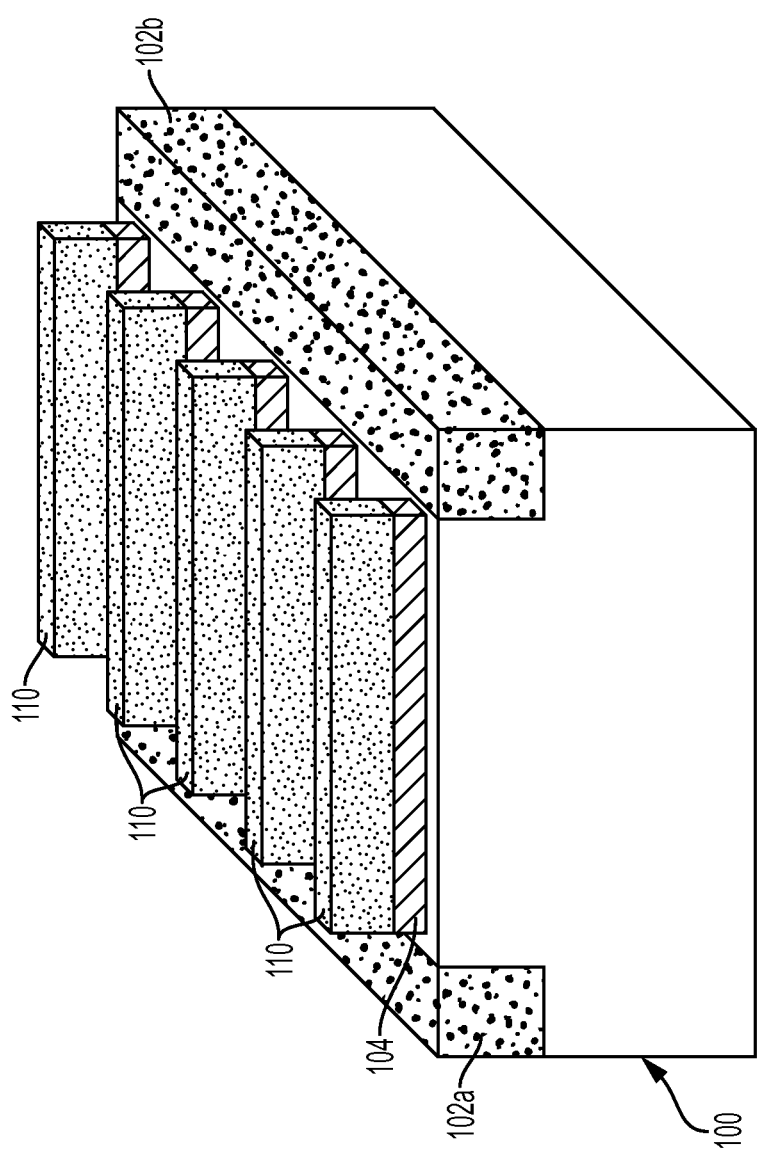

Turning to FIG. 5, the semiconductor substrate 100 is illustrated following a patterning process that transfers the pattern of the fin patterned elements 108 through the insulator layer 104. Accordingly, a plurality of fin hardmasks 110 are formed on remaining portions of the insulator layer 104. Various etchings process may be used to transfer the resist elements 108 including, but not limited to, a reactive ion etch (RIE) process. The patterning process also exposes portions of the semiconductor substrate 100 located on adjacent sides of each fin hardmask 110 as further illustrated in FIG. 5.

Figure 6:
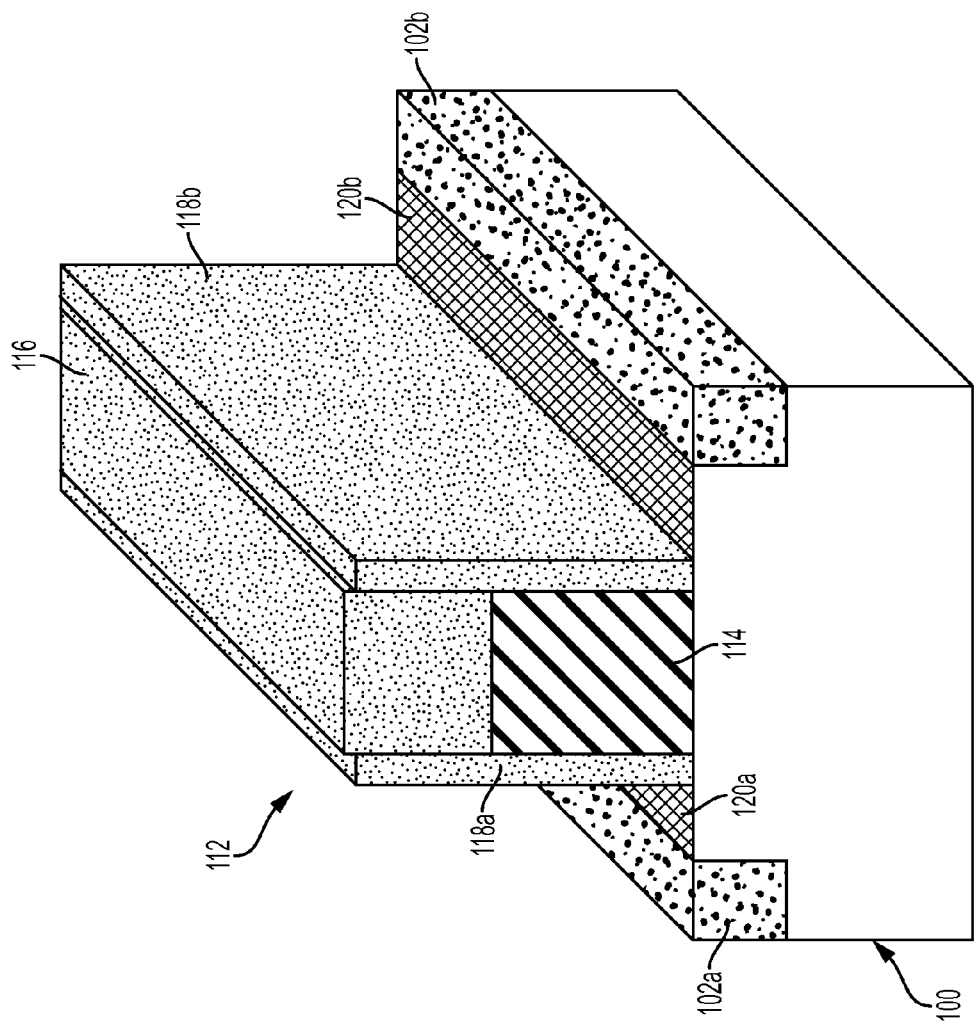

Turning to FIG. 6, a gate structure 112 is formed on an upper surface of the semiconductor substrate 100. In particular, the gate structure 112 is formed over a central portion of semiconductor substrate 100 to cover the fin hardmasks 110. Various well-known processes may be used to form the gate structure 112 as understood by one of ordinary skill in the art. The gate structure 112 includes a dummy gate 114, a gate cap 116, and opposing sidewalls 118a, 118b. The gate cap 116 is formed on an upper surface of the dummy gate 114. The sidewalls 118a-118b are formed on outer walls of the dummy gate 114 and outer walls of the gate cap 116. The dummy gate 114 may include one or more sacrificial materials including, but not limited to, polycrystalline silicon, amorphous silicon, or microcrystal silicon. The gate cap 116 and the side walls 118a-118b may be formed from various masking materials including, but not limited to, SiN.

Still referring to FIG. 6, source/drain regions 120a-120b are formed adjacent to each side of the gate structure 112. According to a non-limiting embodiment, edge-portions of the fin hardmask 110 and underlying insulator layer 104 are etched away to expose the underlying semiconductor substrate 100. The source/drain regions 120a-120b may be formed, for example, by doping available exposed regions of the semiconductor substrate 100 with N-type ions or P-type ions, as understood by one of ordinary skill in the art. The ions are implemented in the exposed regions of the semiconductor substrate 100 at a tilt angle of between about 0 degrees and about 20 degrees.

Figure 7:
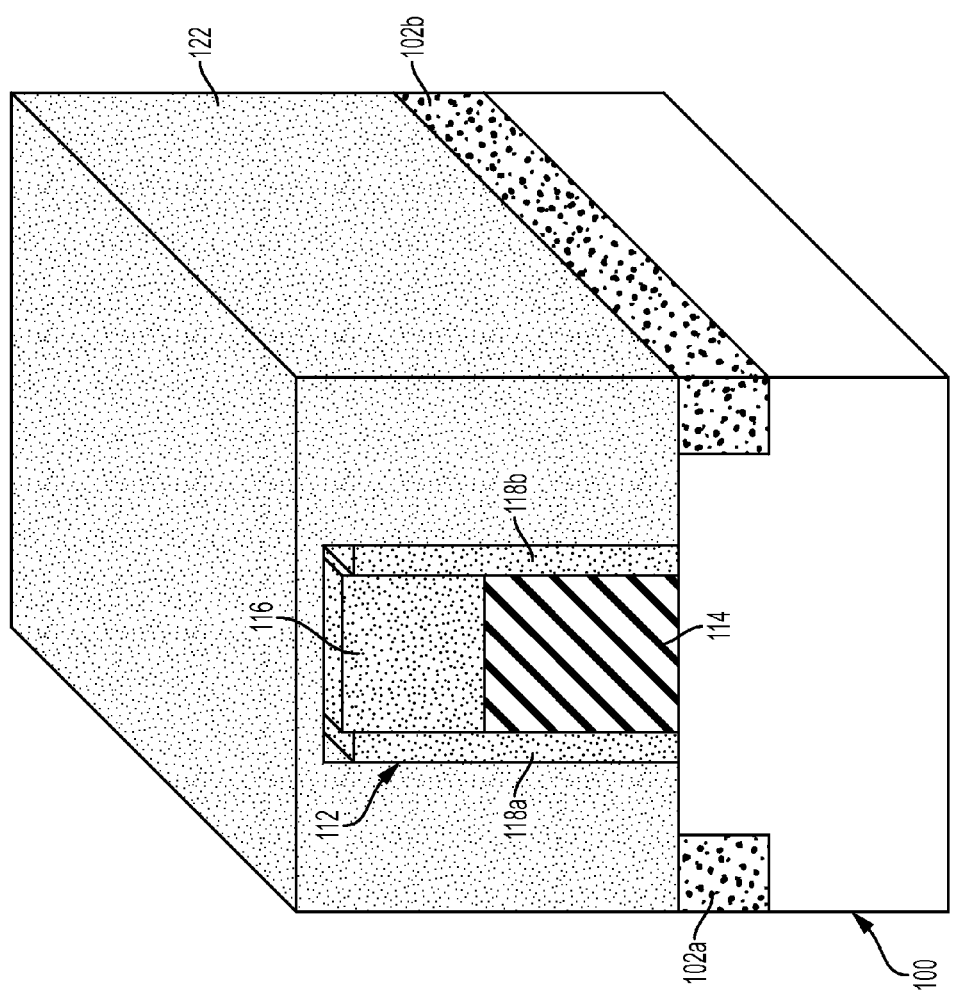

Referring now to FIG. 7, a filler layer 122 is deposited on exposed portions of the semiconductor substrate 100 and encapsulates the gate structure 112. The filler layer 122 can comprise any suitable filler material including a dielectric such as, for example, $SiO_2$. According to an exemplary embodiment, the filler layer 122 is deposited around the gate structure 112 using a high-density plasma (HDP) process.

Figure 8:
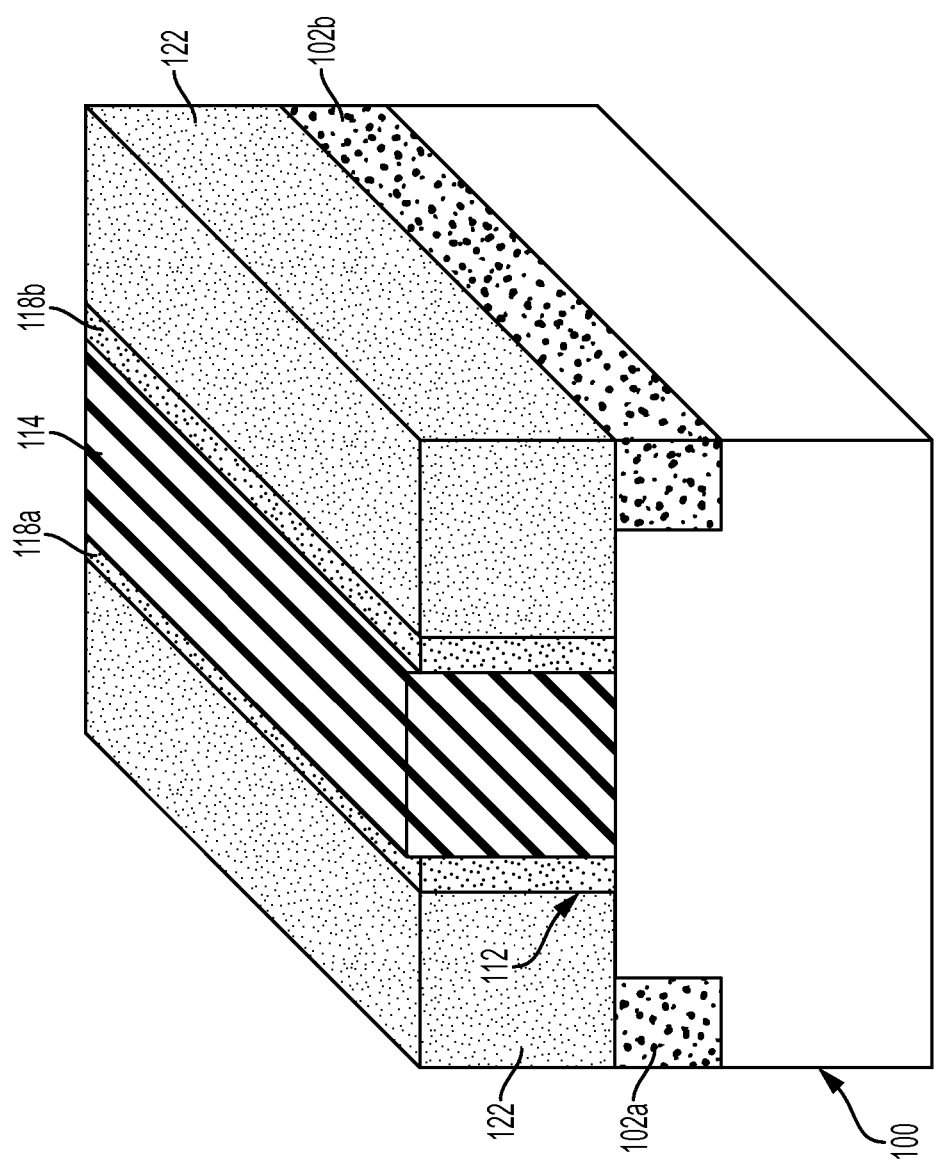

Referring now to FIG. 8, a chemical-mechanical planarization (CMP) process is applied to the semiconductor substrate 100. More specifically, the CMP process may be selective to the sacrificial material of the dummy gate 114. In this manner, the dummy gate 114 can be used as an etch stop layer. Accordingly, the CMP process recesses the filler layer 122, the gate cap 116, and the side walls 118a-118b, while stopping on the upper surface of the dummy gate 114. Thus, the filler layer 122 has a thickness, i.e., height, equivalent to the height of the dummy gate 114 and the remaining portions of the side walls 118a-118b.

Figure 9:
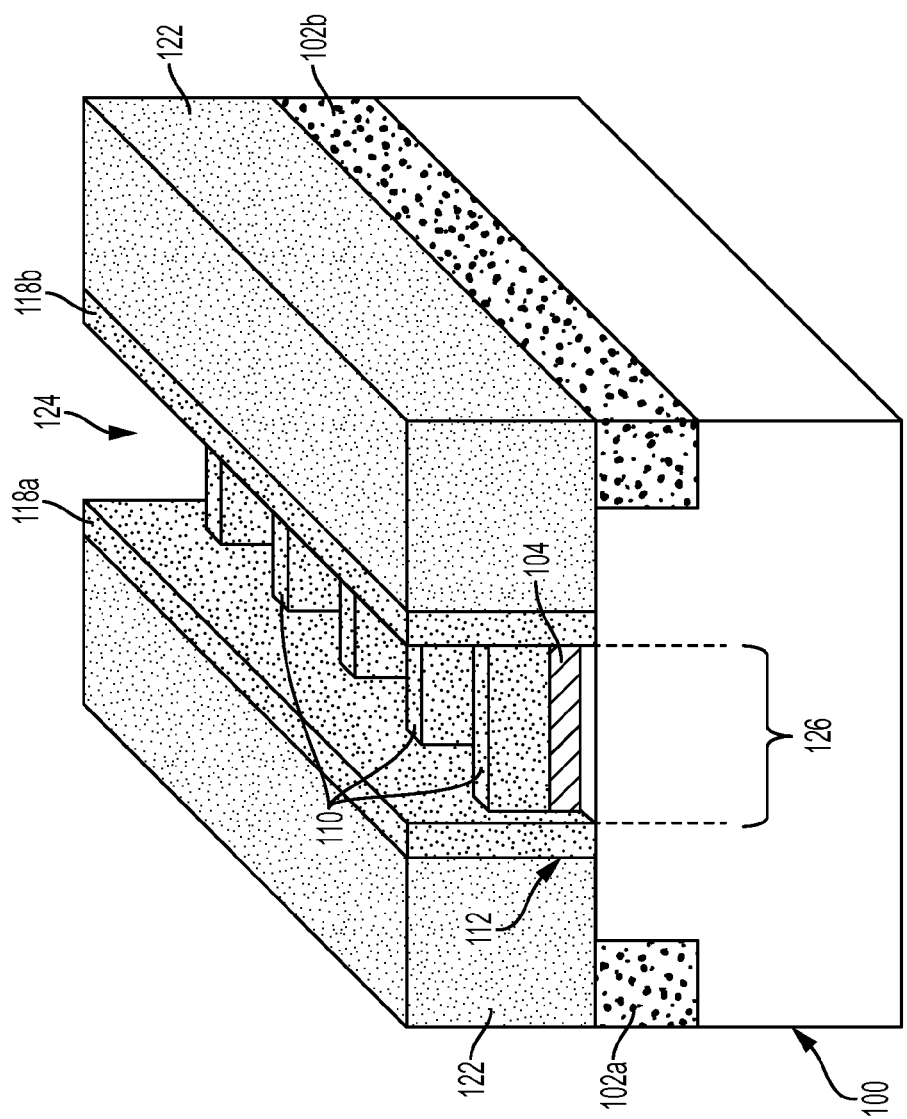

Turning to FIG. 9, the dummy gate 114 is removed, forming a gate trench 124 between the sidewalls 118a-118b and which exposes portions of the fin hardmasks 110 therebetween. Since the gate trench 124 defines a negative pattern of the dummy gate 114, the gate trench 124 is also located centrally over the fin hardmasks 110 and defines a gate region 126 that is interposed between opposing source/drain regions (covered by the filler layer 122 in FIG. 9) of the semiconductor substrate 100. The gate region 126 can have a length ranging from, for example, approximately 30 nm to approximately 50 nm.

The dummy gate 114 can be removed using various techniques such as, for example, wet chemical etching or dry chemical etching. According to a non-limiting embodiment, a wet chemical etch is used to remove the dummy gate structure 112. The etching may also have an effect on the filler layer 122, removing a portion thereof. For example, after completing the etch process to remove the dummy gate 114, the filler layer 122 can be reduced to a thickness of about 115 nanometers to about 125 nanometers. It should be appreciated that at least one embodiment of the invention allows for the fin hardmasks 110 to be placed prior to forming the filler layer 122. In this manner, the fin hardmasks 110 are revealed when the dummy gate 114 is removed, i.e., are already formed within the gate trench 124 and the gate region 126, thereby allowing for more precise and uniform fins to be formed in the gate region 126.

Figure 10:
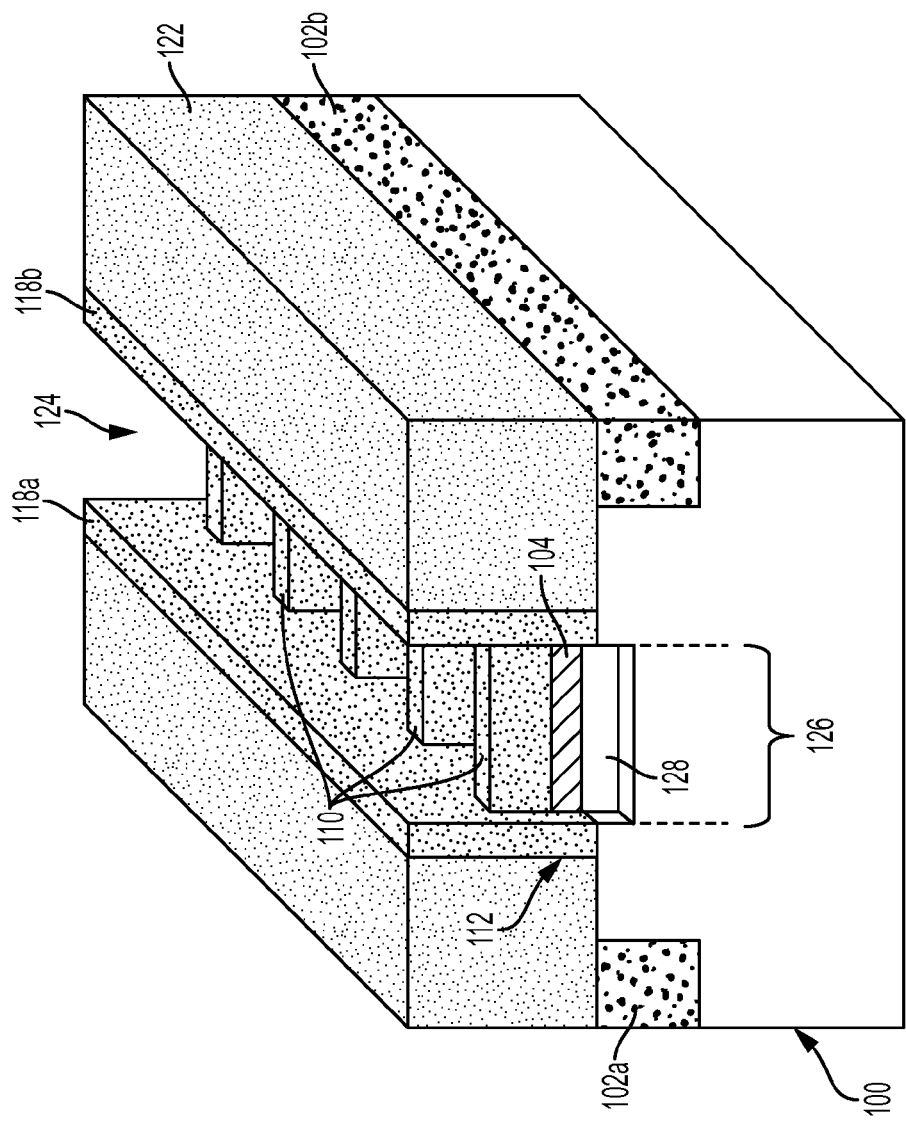
Figure 11A:
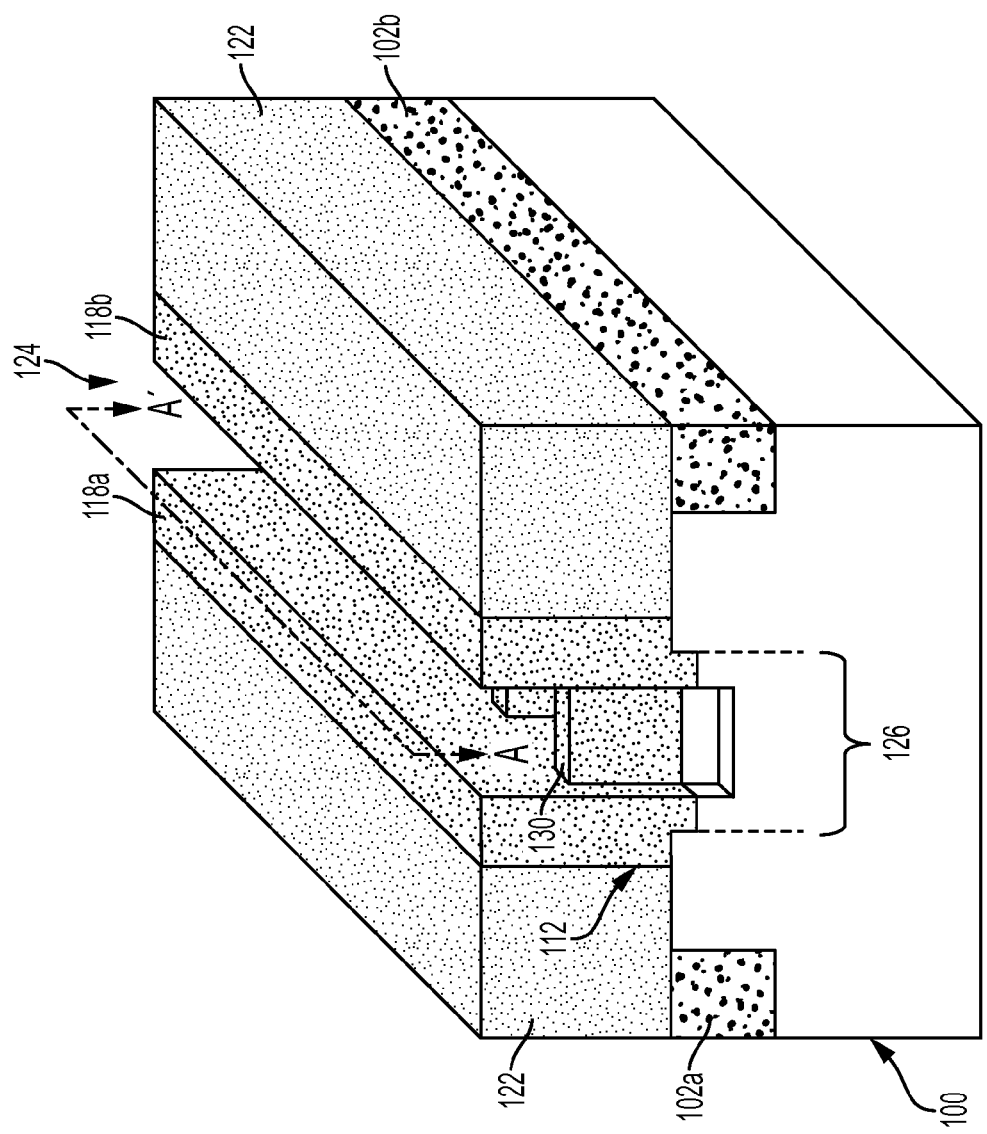
FIG. 11A illustrates the bulk semiconductor substrate of FIG. 10 after forming spacers on sidewalls of the semiconductor fins and after recessing a portion of the semiconductor substrate located beneath the spacers.
Figure 11B:
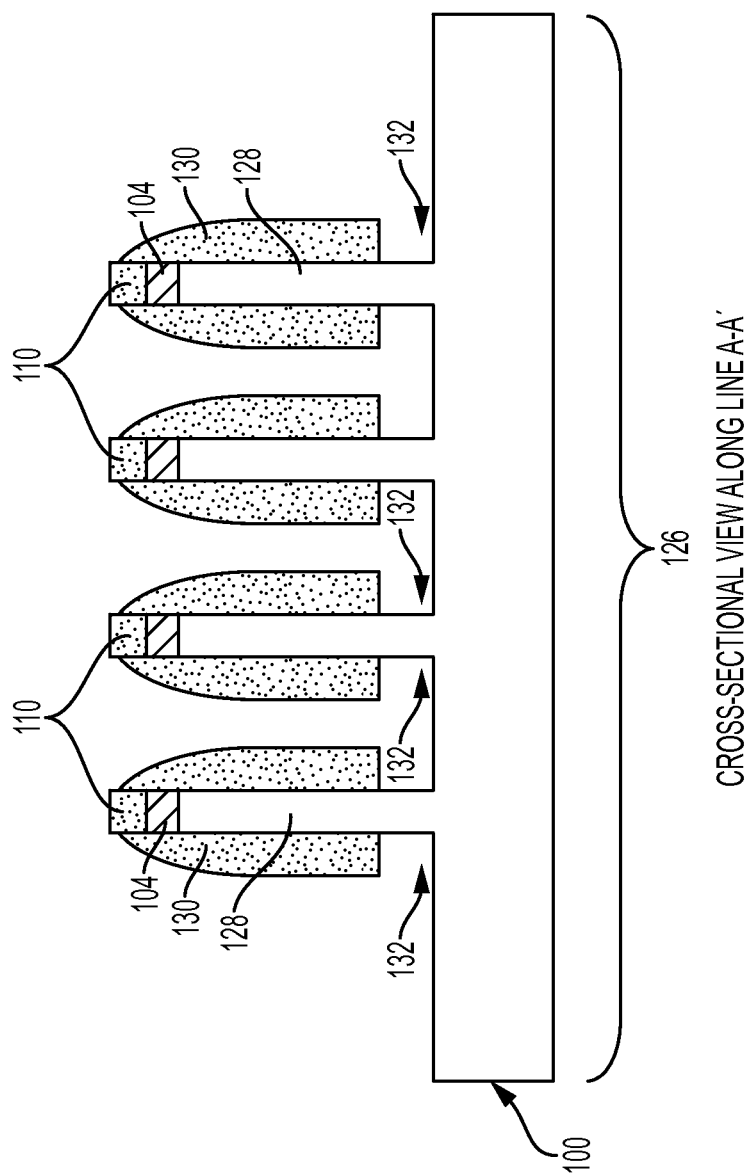
FIG. 11B illustrates the bulk semiconductor substrate of FIG. 11A taken along line A-A'.

Referring to FIG. 10, one or more semiconductor fins 128 are formed in the gate region 126 according to the pattern defined by the fin hardmasks 110. The semiconductor fins 128 have a width ranging from approximately 10 nm to approximately 40 nm, and a height ranging from approximately 20 nm to approximately 25 nm. According to a non-limiting embodiment, a timed reactive ion etch (RIE) being selective to a semiconductor material, such as silicon (Si), is used to remove portions of the semiconductor substrate 100 exposed by the gate trench 124, i.e., not covered by the fin hardmasks 110. It should be appreciated that at least one non-limiting embodiment of the invention etches only the semiconductor material (e.g., Si) located in the gate trench 124. Accordingly, the source/drain regions (covered by the filler layer 122) of the semiconductor substrate 100 remain intact below the filler layer 122. Further, the source/drain regions are self-aligned with the gate trench 124 and, in turn, can be self-aligned with a gate electrode (not shown in FIG. 10) formed in the gate trench 124 as described in greater detail below.

Turning now to FIGS. 11-17, the semiconductor fins 128 are used to form nanowires that are suspended in the gate trench 124 (i.e., the gate region 126) and between the sidewalls 118a-118b of the gate structure 112. With respect to FIGS. 11A-11B, a conformal inner-spacer layer 130 comprising SiN, for example, is deposited in the gate trench 124 and which covers inner portions of the sidewalls 118a-118b. The inner-space layer 130 increases the thickness of the sidewalls 118a-118b while reducing the width of the gate region 126. After depositing the inner-spacer layer 130, a portion of the semiconductor substrate 100 located beneath the fin hardmasks 110 are recessed. Accordingly, a cavity 132 is formed beneath each fin hardmask 110 and exposes a portion of each semiconductor fin 128 as further illustrated in FIG. 11B.

Figure 12A:
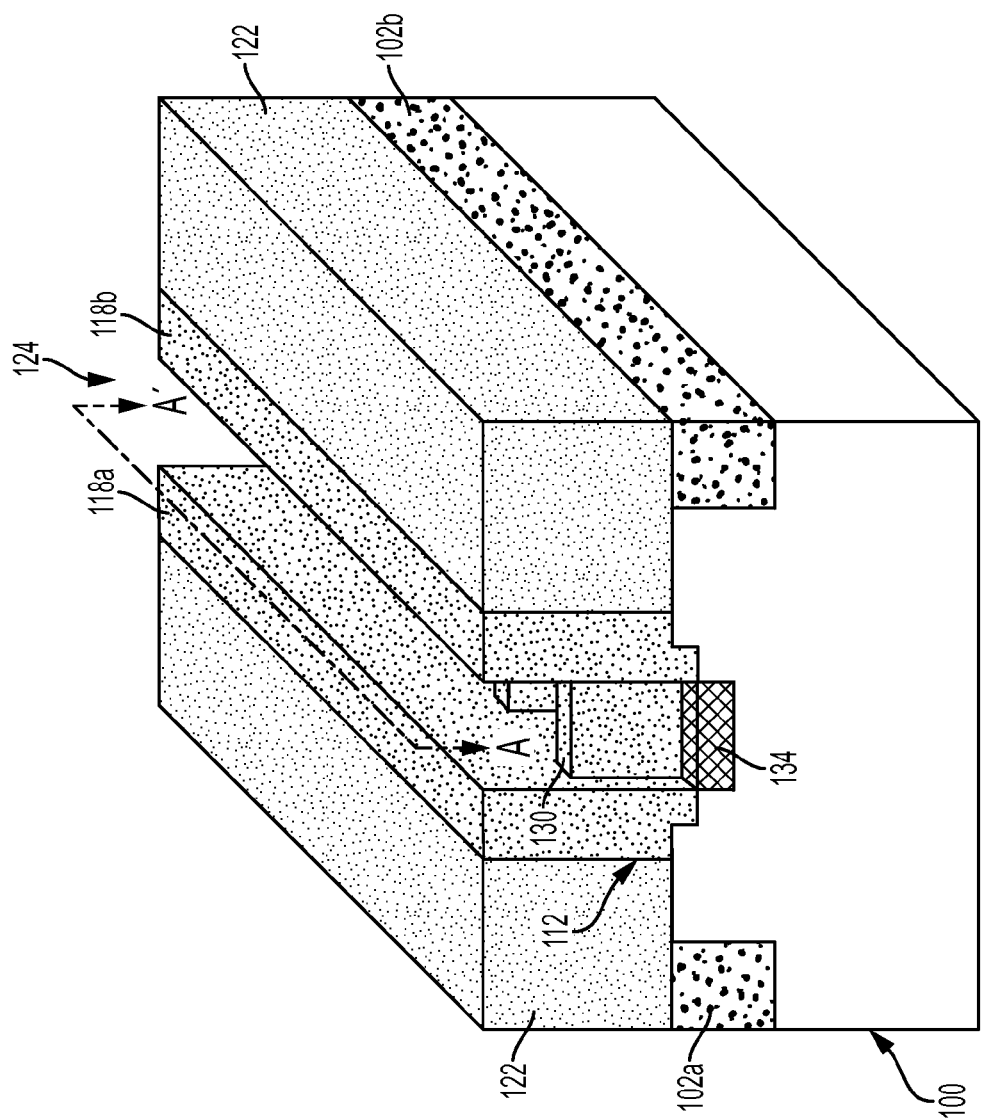
FIG. 12A illustrates the bulk semiconductor substrate of FIGS. 11A and 11B after epitaxially growing a silicon germanium layer on an upper surface of the semiconductor substrate and beneath the hard mask elements located between the side walls.
Figure 12B:
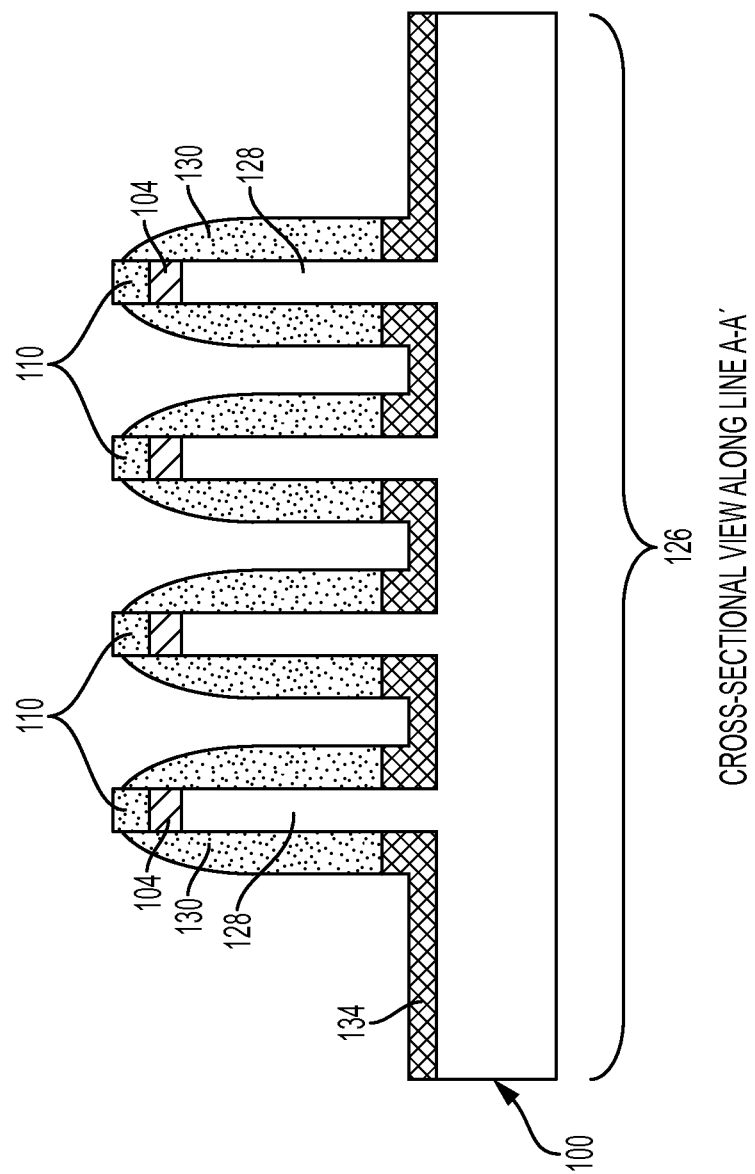
FIG. 12B is a cross-sectional diagram of FIG. 12A taken along line A-A'.

Turning to FIGS. 12A-12B, an epitaxial process is formed that grows an epitaxial base layer 134 from the exposed semiconductor substrate 100 exposed by the gate trench 124. The epitaxial material includes, for example, silicon germanium (SiGe), which can be formed using various epitaxial processes understood by one of ordinary skill in the art. Since the epitaxial material grows only on the semiconductor substrate 100, the epitaxially base layer 134 is grown from the base surface of the semiconductor substrate 100 exposed by the gate trench 124, and covers sides of the semiconductor fins 128 exposed via the cavities 132 beneath the fin hardmask 110 as illustrated in FIG. 12B.

Figure 13:
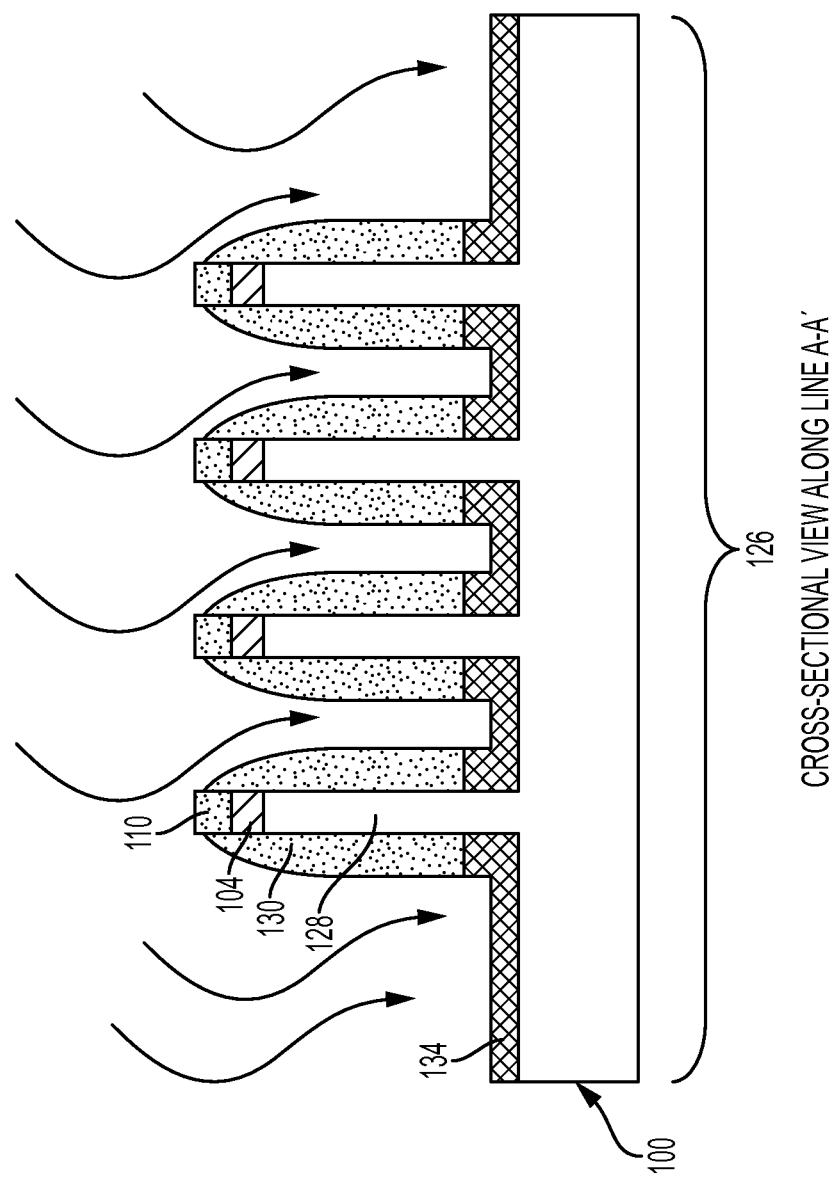
Figure 14:
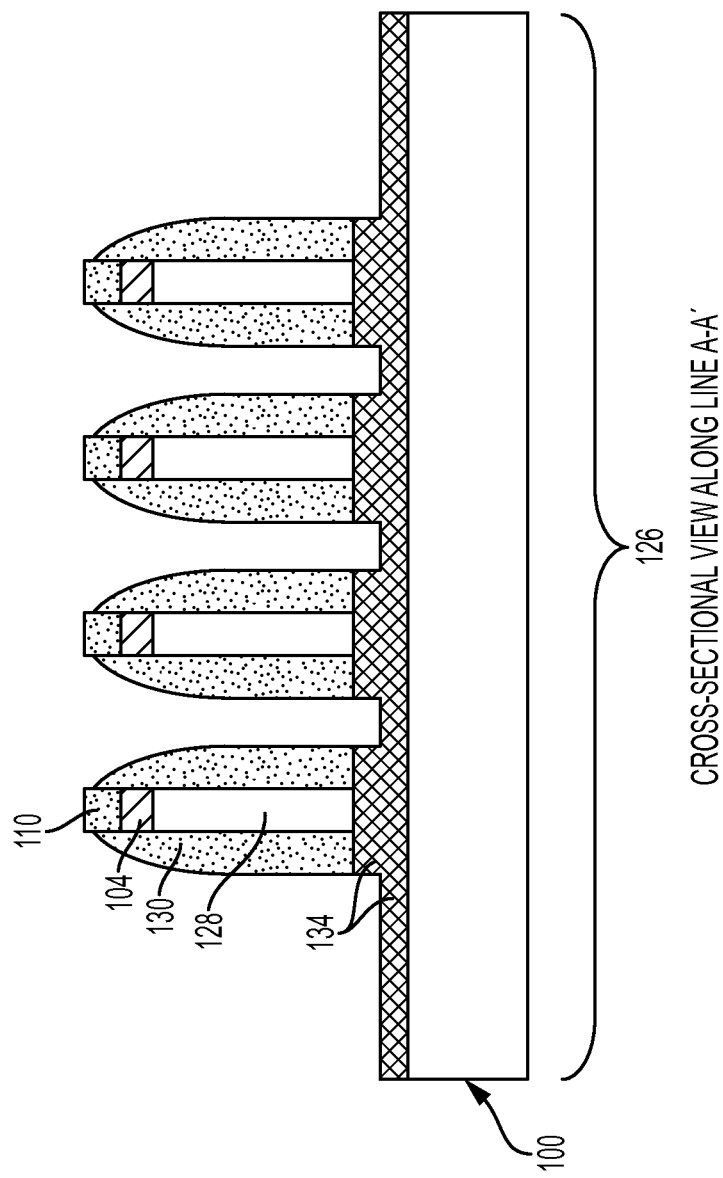

Referring to FIG. 13, the semiconductor substrate 100 is shown undergoing an annealing process. The annealing process applies heat (shown as flowing arrows) to the semiconductor substrate 100, and to the gate region 126 in particular. The heat has a temperature ranging from about 700 Celsius (° C.) to about 1,100° C. In cases where the ambient is non-oxidizing, the heat applied during the annealing process thermally mixes the epitaxial base layer 134 into base portions of the semiconductor fin 128 located beneath the fin hardmasks 110 as further illustrated in FIG. 14. In cases where the ambient is oxidizing, the heat applied during the annealing process condenses the epitaxial base layer 134 onto exposed surfaces of the base portions of the semiconductor fin 128.

Figure 15A:
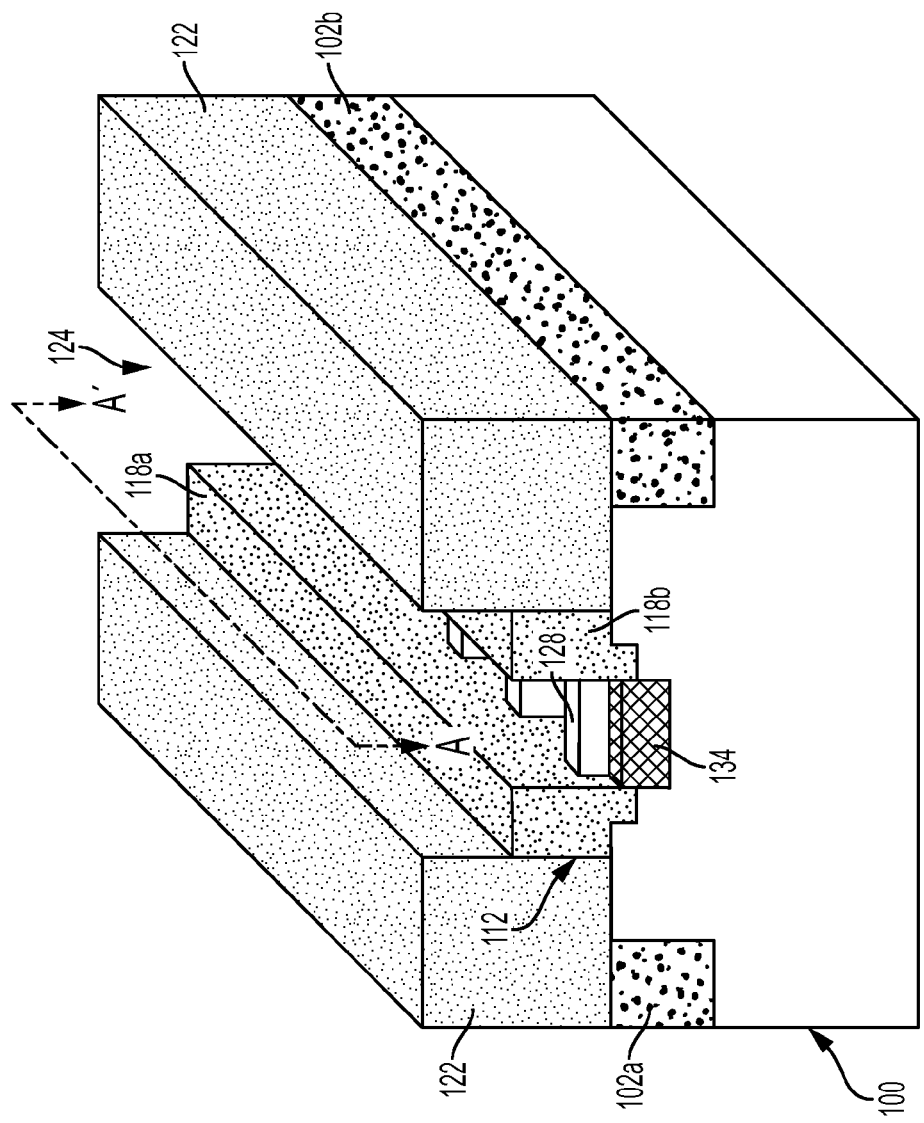
FIG. 15A illustrates the bulk semiconductor substrate of FIG. 14 following an etching process that removes a portion of the spacers and exposes a portion of the semiconductor fins between side walls of the gate structure.

Turning now to FIGS. 15A-15B, the inner-spacer layer 130 is over-etched using an anisotropic etching process, for example, that is selective to semiconductor materials such as silicon (Si) and silicon germanium (SiGe). In this manner, the fin hardmasks 110 are removed thereby exposing the underlying semiconductor fins 128 and the epitaxial base layer 134. The sidewalls 118a-118b and remaining portions of the inner-spacer layer 130 are also recessed below the fill layer 122 and will support a gate electrode (not shown in FIGS. 15A-15B), as discussed in greater detail below.

Figure 16A:
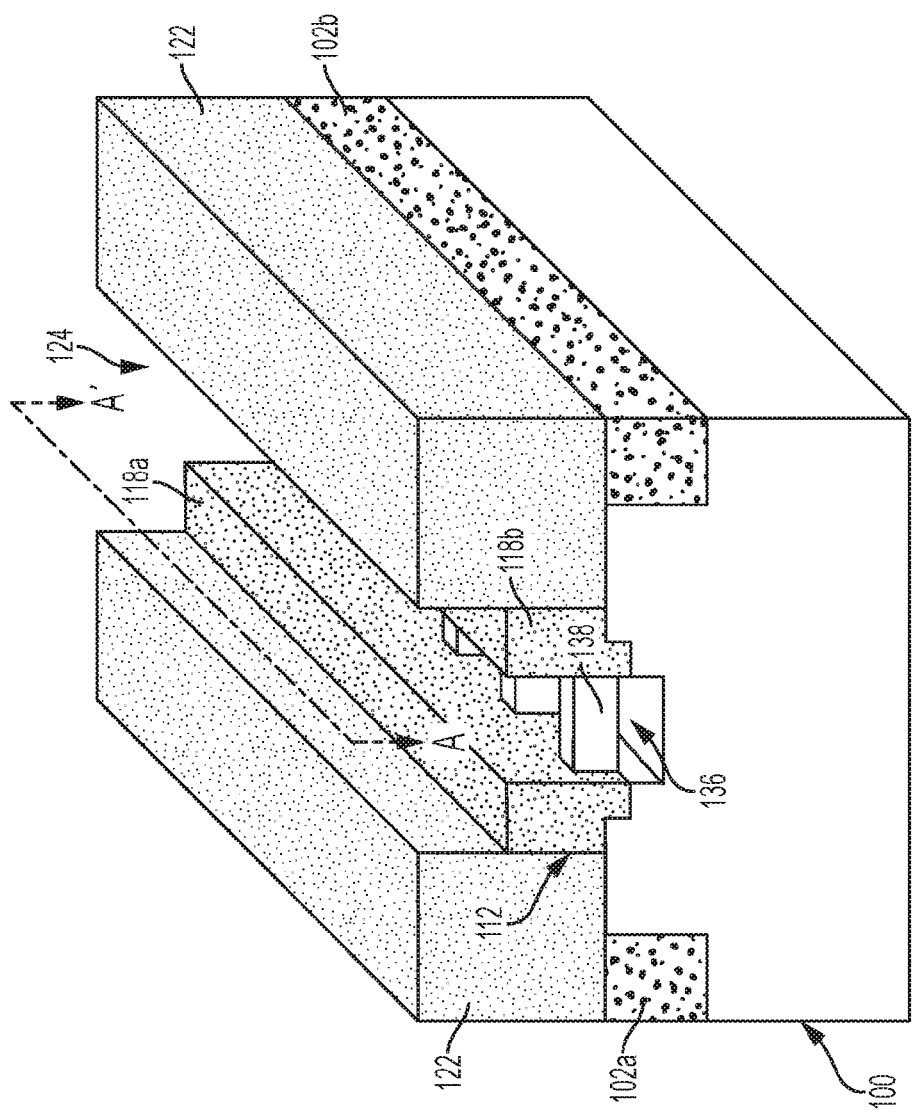
FIG. 16A illustrates the bulk semiconductor substrate of FIGS. 15A and 15B following removal of the silicon germanium such that a plurality of nanowires are suspended between side walls of the gate structure.
Figure 16B:
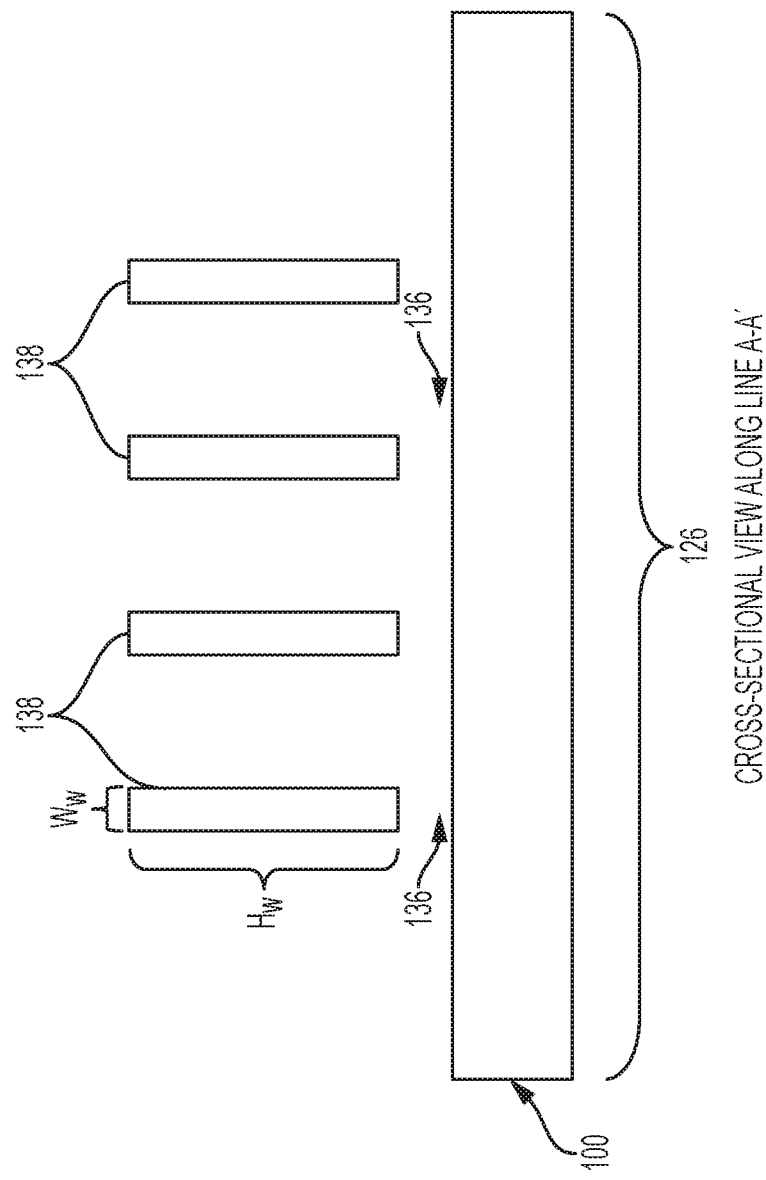
FIG. 16B illustrates the bulk semiconductor substrate of FIG. 16A taken along lines A-A'.

Referring now to FIGS. 16A-16B, an undercut process is performed which selectively removes the epitaxial base layer 134. A combination of an anisotropic etch and an isotropic etch each selective to the semiconductor substrate 100, for example, Si, can be used to remove the SiGe, while maintaining the semiconductor substrate 100 and the semiconductor fins 128. Various chemical etching processes may be applied including, for example, an HCl chemical vapor etch at about 500 degrees Celsius to about 800 degrees Celsius or an ammonium hydroxide-based (NH$_4$OH) chemical etch. In this manner, a tunnel 136 is formed beneath the previously formed semiconductor fins. The tunnel has a height ranging, for example, from approximately 20 nm to approximately 10 nm, and extends along the width of the semiconductor substrate 100. The tunnel 136 essentially defines a plurality of semiconductor nanowires 138 which are located in the gate region 126 and have opposing ends that are anchored by respective sidewalls of the gate structure 112. Accordingly, the entire surface, i.e., all sides, of the nanowires 138 are exposed in the gate trench 124 as further illustrated in FIG. 16B. The nanowires 138 have a height ranging, for example, from approximately 10 nm to approximately 15 nm, and a width ranging, for example, from approximately 10 nm to approximately 40 nm. Further, the nanowires 138 are already formed in the gate trench 126 prior to forming a final gate electrode, and have a pitch ranging, for example, from approximately 40 nm to approximately 100 nm. In this manner, at least one embodiment of the invention allows for a wire-last gate-all-around fabrication process. The wire-last gate-all-around process includes forming the nanowires 138 after forming the source/drain regions 120a-120b and the gate region 126.

Figure 17A:
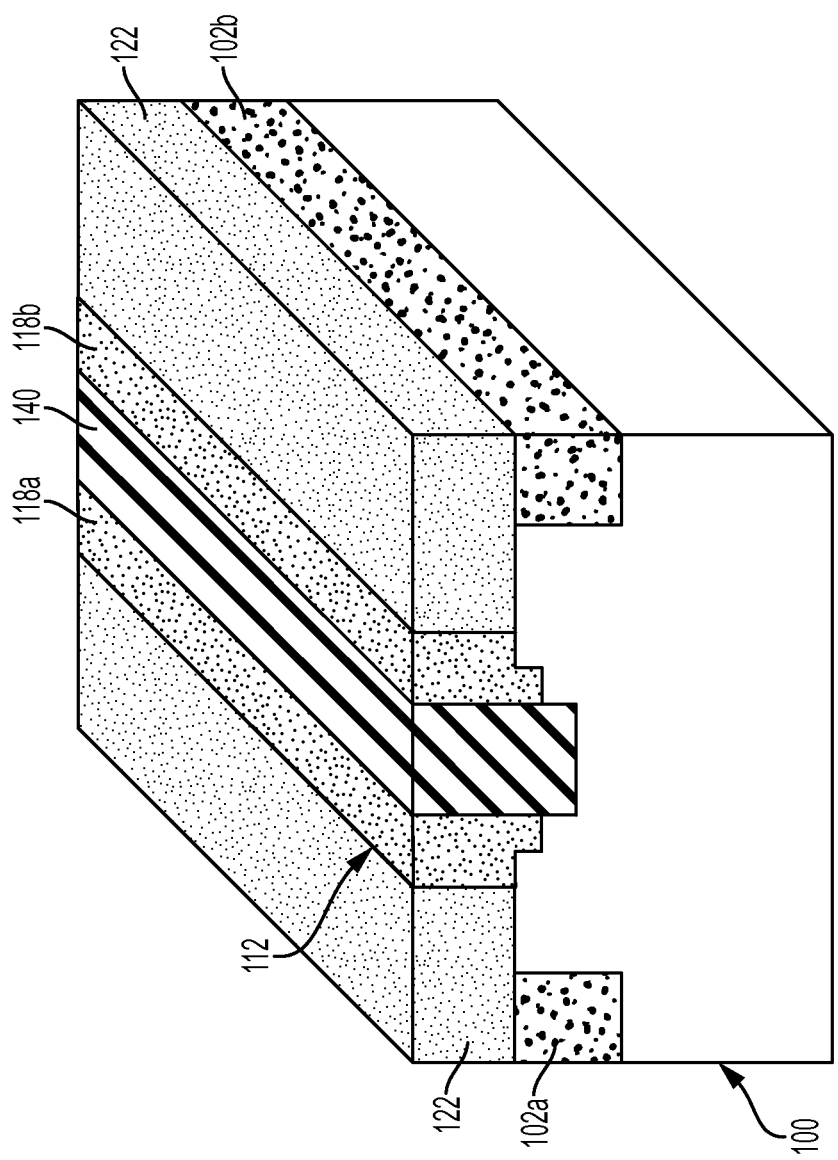
FIG. 17A illustrates the bulk semiconductor substrate of FIGS. 16A-16B after filling the gate trench with a gate electrode material that surrounds the entire surface of each nanowire.
Figure 17B:
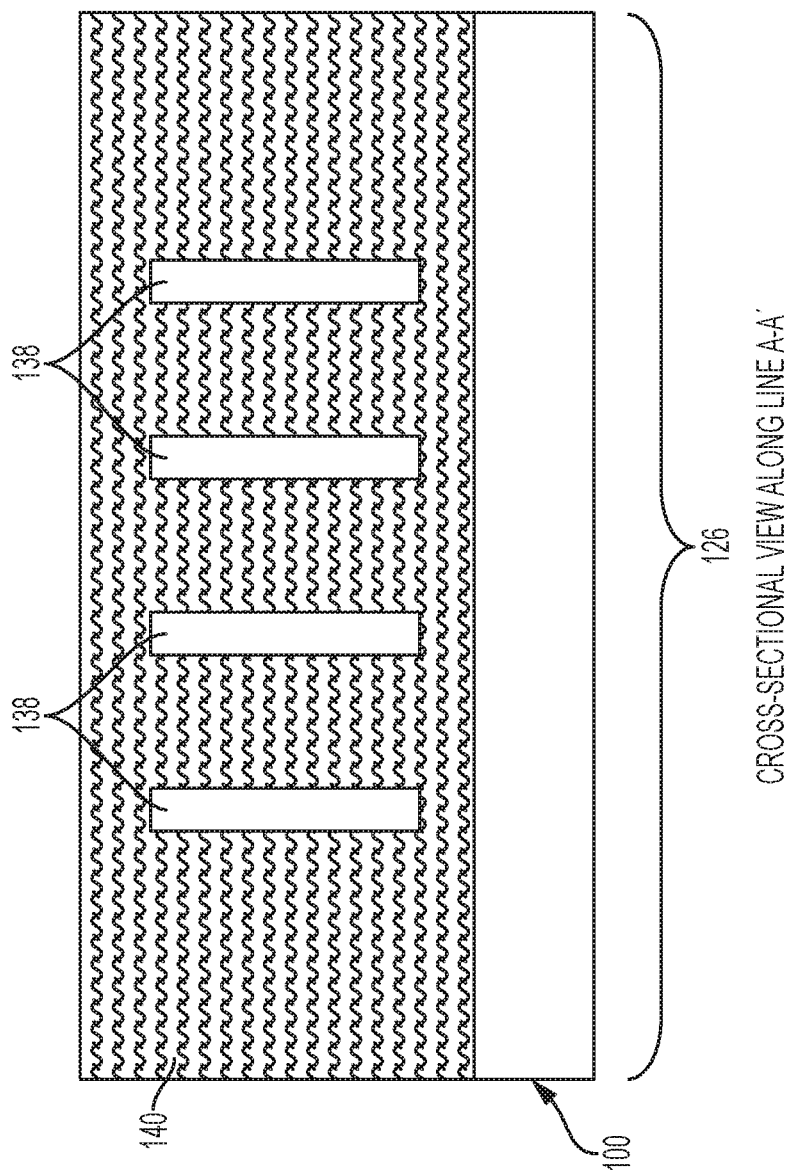
FIG. 17B is a cross-sectional view of the nanowire FET illustrated in FIG. 17A taken along line A-A'.

Referring to FIG. 17A-17B, a gate electrode material 140 is deposited in the gate trench 124. The gate electrode material 140 is formed from various electrically conductive materials including, but not limited to, metal and polysilicon. Since the tunnel 136 is formed beneath the nanowires 138, the gate electrode material 140 contacts the entire surface, i.e., all sides, of each nanowire 138 as further illustrated in FIG. 17B. Although not illustrated, it should be appreciate that a CMP process may be performed such that the gate structure 112, filler layer 122, and gate electrode material 140 are flush with one another. For example, a CMP process can be applied to the filler layer 122, using the gate electrode material 140 as an etch stop layer. In this manner, the filler layer 122 can be recessed such that the gate electrode material 140 (i.e., the gate electrode), the gate structure 112, and the filler layer 122 are flush with one another, i.e., have approximately the same thickness.

Figure 18:
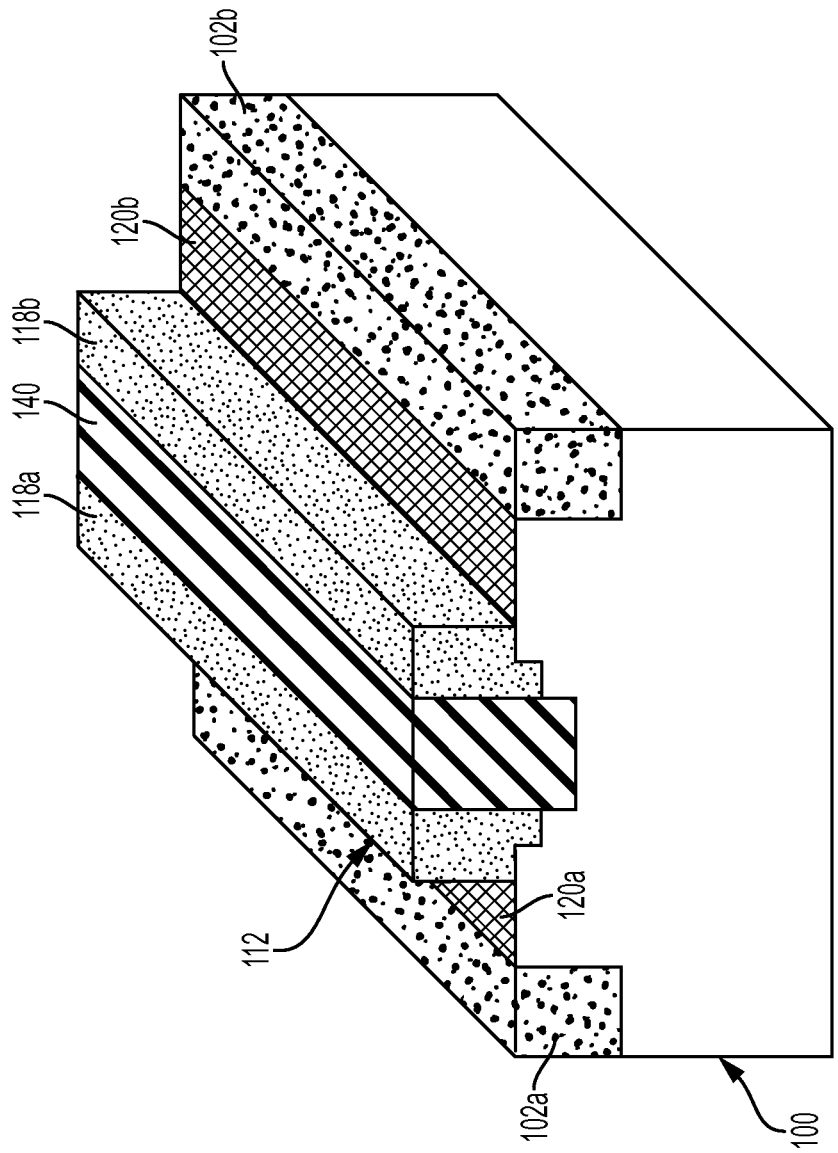

Turning now to FIG. 18, a completed nanowire FET formed on a bulk semiconductor substrate 100 is illustrated after removing the filler layer (shown as 122 in FIG. 17A), and revealing the underlying source/drain regions 120a-120b that are self-aligned with the gate structure 112. Although not shown, additional contact structures may be formed on the upper surface of the gate electrode 140 and the source/drain regions 120a-120b as understood by one of ordinary skill in the art.

As described above, various non-limiting embodiments of the invention provide a nanowire FET including a plurality of nanowires formed on a bulk semiconductor substrate. The nanowires are suspended between sidewalls of a gate stack and a gate electrode is formed on the entire surface, i.e., on all sides, of each nanowire. According to another embodiment, a wire-last gate-all-around fabrication process forms a nanowire FET including a plurality of semiconductor nanowires formed on a bulk semiconductor substrate. The gate electrode contacts the entire surface (i.e., all sides) of each nanowire in the gate region. Accordingly, a gate-all-around FET may be fabricated, while reducing thickness and costs associated with conventional silicon-on-substrate nanowire FETs.

As used herein, the term module refers to a hardware module including an Application Specific Integrated Circuit (ASIC), an electronic circuit, a processor (shared, dedicated, or group) and memory that execute one or more software or firmware programs, a combinational logic circuit, and/or other suitable components that provide the described functionality.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A method of fabricating a nanowire field effect transistor (FET) device, the method comprising:
    forming a plurality of fins on a bulk substrate of a first type semiconductor material;
    forming epitaxial semiconductor regions of a second semiconductor type material adjacent bottom portions of the plurality of fins, the second semiconductor type material being different from the first semiconductor type material;
    performing an anneal so as to condense the second type semiconductor material directly beneath the plurality of fins; and
    selectively removing the second type semiconductor material with respect to the first type semiconductor material to form a plurality of nanowires from the plurality of fins, the plurality of nanowires being suspended over the bulk substrate.

2. The method of claim 1, further comprising forming a gate structure and source/drain regions of the nanowire FET device prior to forming the plurality of nanowires.

3. The method of claim 2, further comprising:
forming a gate structure on an upper surface of the semiconductor substrate, the gate structure including a dummy gate that covers over a central portion of the fin hardmasks;
removing the dummy gate to reveal a gate trench in the gate structure, the gate trench defining a gate region of the nanowire FET device; and
filling the gate trench with an electrically conductive gate material to form a gate electrode that contacts an entire surface of each nanowire.

4. The method of claim 3, wherein etching the semiconductor fins further comprises etching a tunnel beneath the semiconductor fins to form the nanowires.

5. The method of claim 4, wherein the etching the semiconductor fins further comprises etching an epitaxial base layer beneath the semiconductor fins to form the tunnel.

6. The method of claim 5, wherein etching the semiconductor fins further comprises:
prior to etching the tunnel, depositing an inner-spacer layer in the trench that conforms to an outer surface of the fin hardmasks;
etching a portion of the semiconductor substrate located at a base of the fin hardmask to expose a base portion of the semiconductor fins; and
forming the epitaxial base layer between the fin hardmasks and the semiconductor substrate.

7. The method of claim 6, further comprising annealing the epitaxial base layer such that the epitaxial base layer condenses into the base portion of the semiconductor fins.

8. The method of claim 7, wherein etching the tunnel beneath the semiconductor fins further comprises selectively etching an epitaxial material of the epitaxial base layer with respect to a semiconductor material of the semiconductor substrate and the semiconductor fins.

9. The method of claim 8, wherein the forming the epitaxial base layer comprises epitaxially growing silicon germanium (SiGe) on the etched semiconductor substrate and the base portion of the semiconductor fins.

10. The method of claim 9, further comprising prior to patterning the plurality of fin hardmasks, forming a first insulator liner at a first edge region of the semiconductor substrate and forming a second insulator line at second edge region of the semiconductor device opposite the first edge region.

11. The method of claim 10, further comprising forming a first source/drain region between the first insulator liner and the gate structure and forming a second source/drain region between the second insulator liner and the gate structure.

12. The method of claim 11, wherein the first and second source/drain regions are self-aligned with the gate structure.

13. The method of claim 12, wherein the bulk semiconductor substrate comprises silicon (Si).

14. The method of claim 13, wherein the gate material comprises an electrically conductive material selected from the group comprising metal and polysilicon.

15. The method of claim 14, wherein the inner-spacer layer comprises silicon nitride (SiN).

* * * * *